US009312296B2

(12) United States Patent
Taruki et al.

(10) Patent No.: US 9,312,296 B2
(45) Date of Patent: Apr. 12, 2016

(54) SOLID-STATE IMAGING DEVICE AND METHOD FOR MANUFACTURING SOLID-STATE IMAGING DEVICE

(71) Applicant: Kabushiki Kaisha Toshiba, Minato-ku (JP)

(72) Inventors: Hisayuki Taruki, Oita (JP); Nagataka Tanaka, Oita (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/483,464

(22) Filed: Sep. 11, 2014

(65) Prior Publication Data

US 2015/0115338 A1     Apr. 30, 2015

(30) Foreign Application Priority Data

Oct. 30, 2013   (JP) ................................. 2013-225904

(51) Int. Cl.
*H01L 27/146*   (2006.01)
*H01L 21/762*   (2006.01)
*H01L 31/02*    (2006.01)
*H01L 31/0352*  (2006.01)
*H01L 27/142*   (2014.01)

(52) U.S. Cl.
CPC .... *H01L 27/14641* (2013.01); *H01L 21/76224* (2013.01); *H01L 27/142* (2013.01); *H01L 27/146* (2013.01); *H01L 27/1463* (2013.01); *H01L 27/14603* (2013.01); *H01L 27/14609* (2013.01); *H01L 27/14612* (2013.01); *H01L 27/14616* (2013.01); *H01L 27/14643* (2013.01); *H01L 27/14689* (2013.01); *H01L 31/02002* (2013.01); *H01L 31/02016* (2013.01); *H01L 31/0352* (2013.01); *H01L 31/035281* (2013.01)

(58) Field of Classification Search
CPC .................. H01L 31/02016; H01L 31/02019; H01L 31/02002; H01L 31/02005; H01L 31/0248; H01L 31/0352; H01L 31/035272; H01L 31/035281; H01L 31/03529; H01L 27/14; H01L 27/142; H01L 27/144; H01L 27/146
See application file for complete search history.

(56) References Cited

U.S. PATENT DOCUMENTS 7,687,299 B2   3/2010   Ichikawa
7,939,859 B2   5/2011   Tsuno (Continued)

FOREIGN PATENT DOCUMENTS

JP       5-3311        1/1993
JP       2003-31785 A  1/2003

(Continued)

OTHER PUBLICATIONS

Office Action issued Oct. 19, 2015 in Taiwanese Patent Application No. 103134431 (with English language translation).

*Primary Examiner* — Eduardo A Rodela
(74) *Attorney, Agent, or Firm* — Oblon, McClelland, Maier & Neustadt, L.L.P.

(57) ABSTRACT

A solid-state imaging device according to an embodiment includes photoelectric conversion devices, a dopant layer, a low concentration region, and a transistor. The photoelectric conversion devices are disposed on a semiconductor layer. The dopant layer is disposed on a layer same as the semiconductor layer where photoelectric conversion devices are arrayed, and includes dopant having a conductivity type reverse to a charge accumulating region of the photoelectric conversion device. The low concentration region is disposed inside the dopant layer and has dopant concentration lower than the dopant layer. A transistor includes an active region disposed on the dopant layer.

12 Claims, 8 Drawing Sheets

(56) References Cited

U.S. PATENT DOCUMENTS

| | | | |
|---|---|---|---|
| 2006/0006489 A1* | 1/2006 | Park | 257/462 |
| 2006/0256221 A1* | 11/2006 | Mckee et al. | 348/308 |
| 2009/0289282 A1 | 11/2009 | Tsuno | |
| 2013/0087875 A1* | 4/2013 | Kobayashi et al. | 257/432 |

FOREIGN PATENT DOCUMENTS

| | | |
|---|---|---|
| JP | 2003-333431 | 11/2003 |
| JP | 2005-286168 | 10/2005 |
| JP | 2009-283649 | 12/2009 |

* cited by examiner

SOLID-STATE IMAGING DEVICE AND METHOD FOR MANUFACTURING SOLID-STATE IMAGING DEVICE

CROSS-REFERENCE TO RELATED APPLICATION

This application is based upon and claims the benefit of priority from Japanese Patent Application No. 2013-225904, filed on Oct. 30, 2013; the entire contents of which are incorporated herein by reference.

FIELD

Embodiment described herein relates generally to a solid-state imaging device and a method for manufacturing the solid-state imaging device.

BACKGROUND

In related arts, a Complementary Metal Oxide Semiconductor (CMOS) image sensor provided in a solid-state imaging device includes a plurality of photoelectric conversion devices, a floating diffusion, a transfer transistor, a reset transistor, an amplification transistor, and so on.

The photoelectric conversion device is a device that photoelectrically converts incident light to signal charge in accordance with a light amount and accumulates the signal charge. The transfer transistor is a transistor that transfers the signal charge accumulated in the photoelectric conversion device to the floating diffusion. The amplification transistor is a transistor that amplifies the signal charge transferred to the floating diffusion. The reset transistor is a transistor that resets electrical potential of the floating diffusion to a prescribed electrical potential.

In the mentioned CMOS image sensor, a charge accumulating region for a plurality of the photoelectric conversion devices and channels of the above-described transistors are generally disposed in a same semiconductor layer. Therefore, in the CMOS image sensor, an active region for the transistors is provided inside a well having conductivity type reverse to the charge accumulating region of the photoelectric conversion device and dopant concentration of the well is made higher than a predetermined value, thereby isolating the photoelectric conversion devices from the channels of the transistors.

However, in the case of increasing the dopant concentration in the well in order to improve device isolation characteristics in the solid-state imaging device, modulation degree of the amplification transistor is lowered and a Carrier to Noise Ratio (C/N ratio) of an output signal may be deteriorated, for example.

DETAILED DESCRIPTION

According to a present embodiment, a solid-state imaging device is provided. The solid-state imaging device includes a plurality of photoelectric conversion devices, a dopant layer, a low concentration region, and a transistor. The plurality of photoelectric conversion devices is disposed on a semiconductor layer. The dopant layer is disposed on a layer same as the semiconductor layer where the photoelectric conversion devices are arrayed, and includes dopant having conductivity type reverse to a charge accumulating region of the photoelectric conversion devices. The low concentration region is provided inside the dopant layer, and has the dopant concentration lower than the dopant layer. The transistor is provided with an active region in the dopant layer.

The solid-state imaging device and a method for manufacturing the solid-state imaging device according to an embodiment will be described below with reference to the attached drawings. Note that the present invention is not to be limited to the embodiment.

Figure 1:
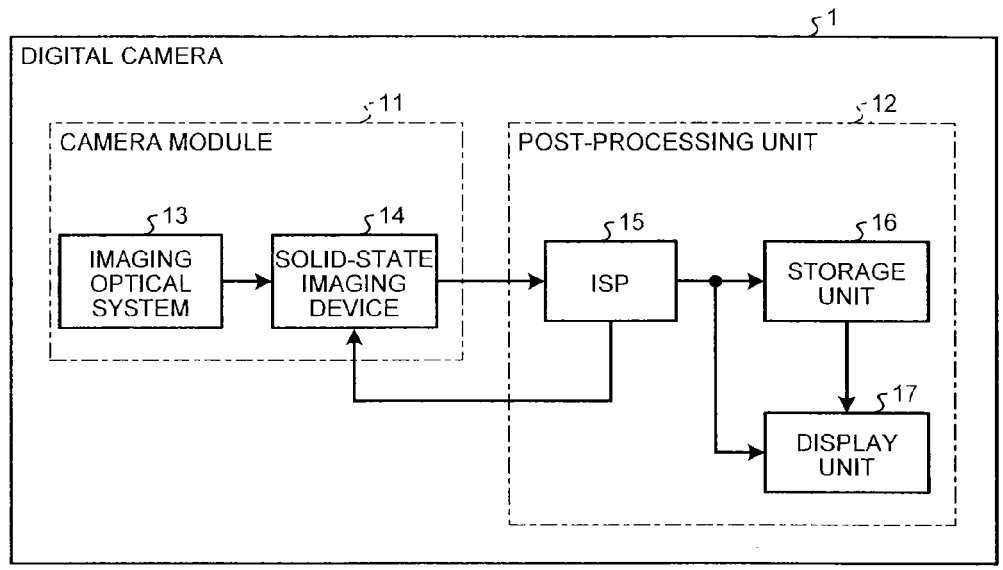
FIG. 1 is a block diagram illustrating a schematic configuration of a digital camera including a solid-state imaging device according to an embodiment.

FIG. 1 is a block diagram illustrating a schematic configuration of a digital camera 1 including the solid-state imaging device 14 according to the embodiment. As illustrated in FIG. 1, a digital camera 1 includes a camera module 11 and a post-processing unit 12.

The camera module 11 includes an imaging optical system 13 and a solid-state imaging device 14. The imaging optical system 13 captures light from a subject and forms an image of the subject. The solid-state imaging device 14 picks up the image of the subject formed by the imaging optical system 13, and outputs an image signal obtained by the image pickup to the post-processing unit 12. The above camera module 11 is applied to, for example, an electronic device such as a mobile terminal with a camera, besides the digital camera 1.

The post-processing unit 12 includes an Image Signal Processor (ISP) 15, a storage unit 16, and a display unit 17. The ISP 15 applies signal processing to the image signal received from the solid-state imaging device 14. The mentioned ISP 15 executes, for example, image quality enhancing processing such as noise removing processing, defective pixel correction processing, and resolution conversion processing.

Figure 2:
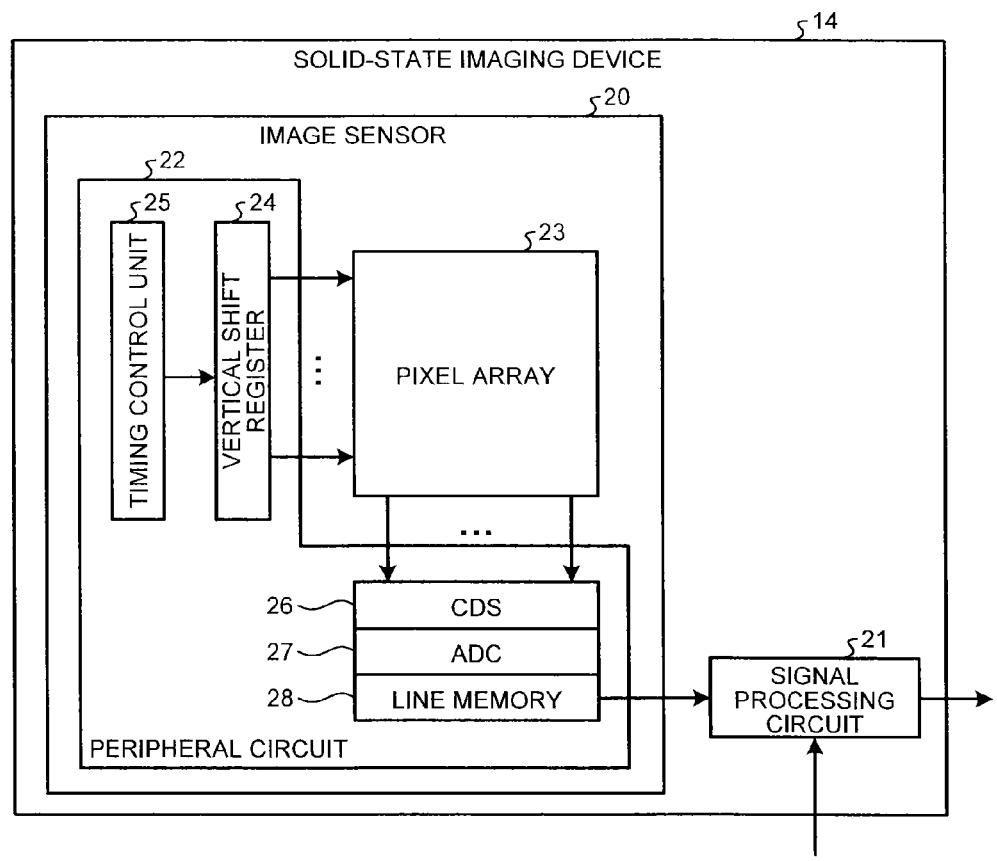
FIG. 2 is a block diagram illustrating a schematic configuration of the solid-state imaging device according to the embodiment.

Further, the ISP 15 outputs an image signal after the signal processing to the image storage unit 16, the display unit 17, and a later-described signal processing circuit 21 included in the solid-state imaging device 14 inside the camera module 11 (see FIG. 2). The image signal fed back from the ISP 15 to the camera module 11 is used for adjusting and controlling the solid-state imaging device 14.

The storage unit 16 stores the image signal received from the ISP 15 as an image. Further, the storage unit 16 outputs an image signal of the stored image to the display unit 17 in accordance with a user's operation and the like. The display unit 17 displays an image in accordance with the image signal received from the ISP 15 or the storage unit 16. The display unit 17 is, for example, a liquid crystal display.

Next, the solid-state imaging device 14 provided in the camera module 11 will be described with reference to FIG. 2. FIG. 2 is a block diagram illustrating a schematic configuration of the solid-state imaging device 14 according to the embodiment. As illustrated in FIG. 2, the solid-state imaging device 14 includes an image sensor 20 and a signal processing circuit 21.

Here, description will be given for a case where an image sensor 20 is a so-called front side illumination type complementary metal oxide semiconductor (CMOS) image sensor in which a wiring layer is formed on a surface receiving incident light of the photoelectric conversion device that photoelectrically converts the incident light.

Note that the image sensor 20 according to the present embodiment is not limited to the front side illumination type CMOS image sensor, and may be an arbitrary image sensor such as a back side illumination type CMOS image sensor and a charge coupled device (CCD) image sensor.

The image sensor 20 includes a peripheral circuit 22 and a pixel array 23. Further, the peripheral circuit 22 includes a vertical shift register 24, a timing control unit 25, a correlated double sampling unit (CDS) 26, an analog/digital converting unit (ADC) 27, and a line memory 28.

The pixel array 23 is disposed on an imaging region of the image sensor 20. In this pixel array 23, photodiodes, namely, a plurality of photoelectric conversion devices corresponding to respective pixels of the pickup image, are disposed in a two-dimensional array in a horizontal direction (row direction) and a vertical direction (column direction). Further, in the pixel array 23, each of the photoelectric conversion devices corresponding to each of the pixels generates a signal charge (e.g., electron) in accordance with an amount of the incident light.

The timing control unit 25 is a processing unit that outputs, to the vertical shift register 24, a pulse signal to be a basis of operation timing. The vertical shift register 24 is a processing unit that outputs a selection signal to the pixel array 23. The selection signal is a signal for selecting photoelectric conversion devices in a row unit from among the plurality of photoelectric conversion devices disposed in the array (rows and columns) so as to read out the signal charge from the selected photoelectric conversion devices.

The pixel array 23 outputs, from the photoelectric conversion devices to the CDS 26, signal charge accumulated in each of the photoelectric conversion devices selected in a row unit by the selection signal received from the vertical shift register 24, as a pixel signal representing brightness of each pixel. Note that an exemplary circuit configuration of the pixel array 23 will be described later with reference to FIG. 3.

The CDS 26 is a processing unit that removes noise from the pixel signal received from the pixel array 23 by the correlated double sampling, and outputs the pixel signal to the ADC 27. The ADC 27 is a processing unit that converts an analog pixel signal received from the CDS 26 to a digital pixel signal, and output the digital pixel signal to the line memory 28. The line memory 28 is a processing unit that temporarily holds the pixel signal received from the ADC 27, and outputs the pixel signal to the signal processing circuit 21 in a row unit of the photoelectric conversion devices in the pixel array 23.

The signal processing circuit 21 is a processing unit that executes prescribed signal processing for the pixel signal received from the line memory 28, and outputs the pixel signal to the post-processing unit 12. The signal processing circuit 21 applies signal processing to the pixel signal, such as lens shading correction, defect correction, and noise reduction processing.

Thus, in the image sensor 20, the plurality of photoelectric conversion devices disposed on the pixel array 23 photoelectrically converts the incident light to the signal charge in accordance with the received light amount, and accumulates the signal charge, and then the peripheral circuit 22 reads out the signal charge accumulated in each of the photoelectric conversion devices as the pixel signal, thereby forming an image.

Figure 3:
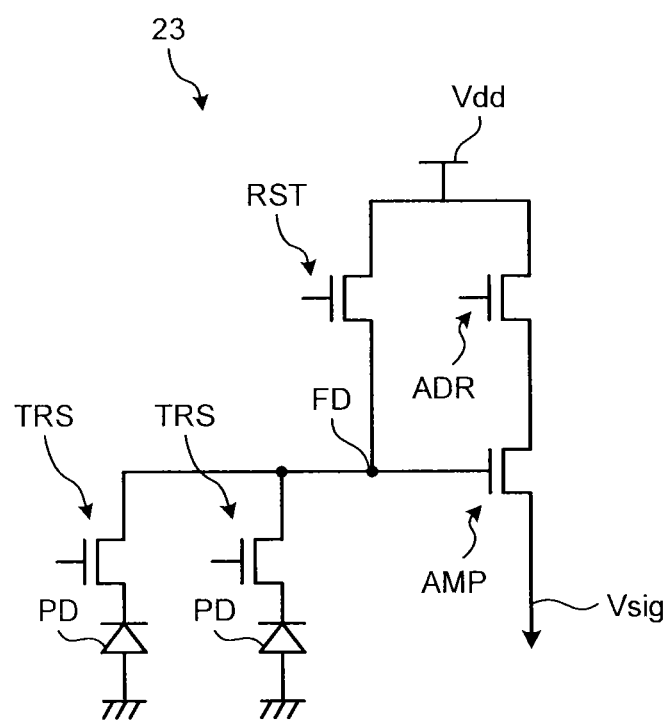
FIG. 3 is an explanatory diagram illustrating an exemplary circuit configuration of a pixel array according to the embodiment.

Next, a configuration and operation of the pixel array 23 will be described briefly with reference to FIG. 3. FIG. 3 is an explanatory diagram illustrating an exemplary circuit configuration of the pixel array 23 according to the embodiment. Note that the circuit illustrated in FIG. 3 is a circuit selectively extracting a portion corresponding to one pixel of the pickup image inside the pixel array 23.

Here, description will be given for a case in which two photoelectric conversion devices PD are provided corresponding to one pixel of a pickup image; however, the number of the photoelectric conversion devices PD corresponding to one pixel of the pickup image may be one, or more than two.

As illustrated in FIG. 3, the pixel array 23 includes two photoelectric conversion devices PD and two transfer transistor TRS. Further, the pixel array 23 includes a floating diffusion FD, an amplification transistor AMP, a reset transistor RST, and an address transistor ADR. Note that an exemplary physical arrangement of the two photoelectric conversion devices PD, two transfer transistor TRS, floating diffusion FD, amplification transistor AMP, and reset transistor RST will be described with reference to FIG. 4.

Each of the photoelectric conversion devices PD is a photodiode having a cathode connected to a ground and an anode connected to a source of the transfer transistor TRS. Respective drains of the two transfer transistors TRS are connected to one floating diffusion FD.

When a transfer signal is received at a gate electrode, each of the transfer transistors TRS transfers the signal charge photoelectrically converted by the photoelectric conversion device PD to the floating diffusion FD. The floating diffusion FD is connected to a source of the reset transistor RST.

Further, the reset transistor RST has a drain connected to a power supply voltage line Vdd. The above-described reset transistor RST resets electrical potential of the floating diffusion FD to the electrical potential of power supply voltage when a reset signal is received at the gate electrode before the signal charge is transferred to the floating diffusion FD.

Further, the floating diffusion FD is connected to a gate electrode of the amplification transistor AMP. The mentioned amplification transistor AMP has a source connected to an output signal line Vsig that outputs the signal charge to the CDS 26 and has a drain connected to a source of the address transistor ADR. Further, the address transistor ADR has a drain connected to a power supply voltage line Vdd.

In the pixel array 23, when an address signal is received at a gate electrode of the address transistor ADR, a signal amplified in accordance with a charge amount of the signal charge transferred to the floating diffusion FD is output from the amplification transistor AMP to the CDS 26.

Figure 4:
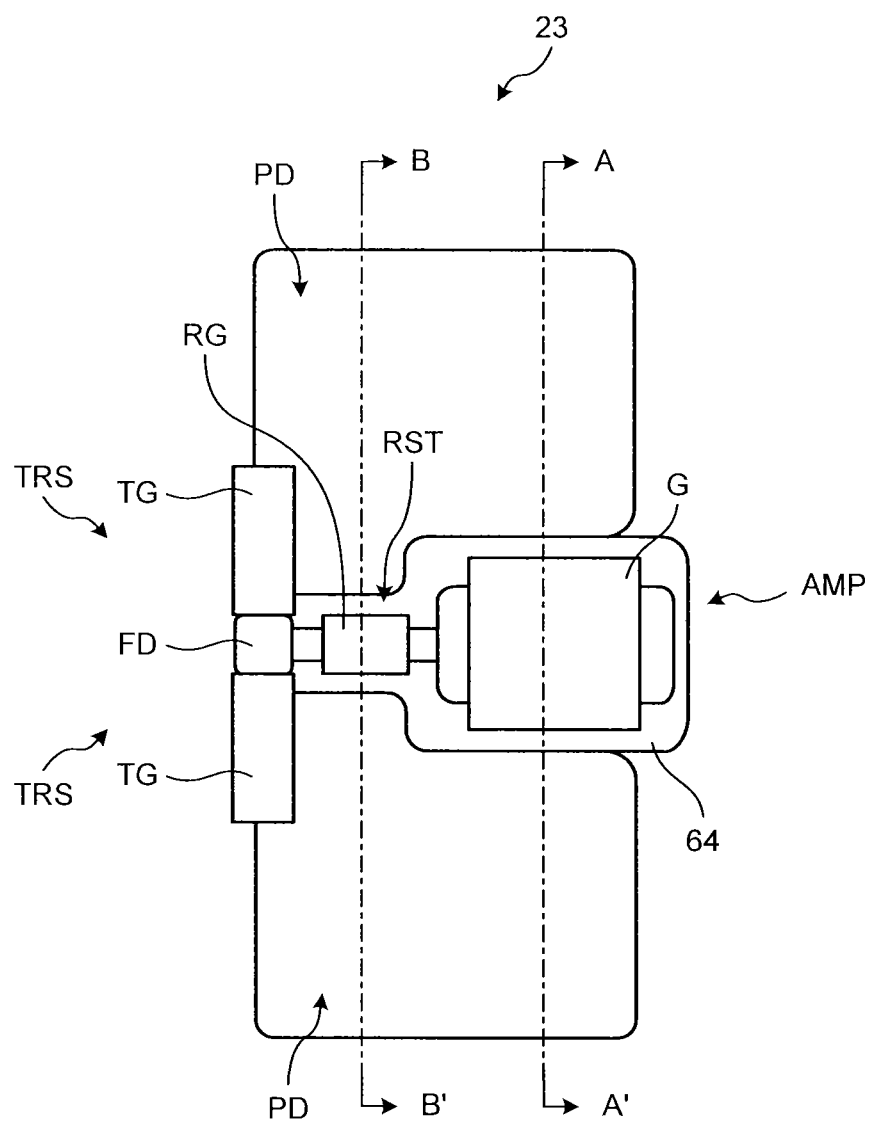
FIG. 4 is an explanatory diagram illustrating a top view of the pixel array according to the embodiment.

Next, an exemplary physical arrangement for the two photoelectric conversion devices PD, two transfer transistors TRS, floating diffusion FD, amplification transistor AMP, and reset transistor RST will be described with reference to FIG. 4. FIG. 4 is an explanatory diagram illustrating a top view of the pixel array 23 according to the embodiment. Note that a portion corresponding to one pixel of the pickup image in the pixel array 23 is illustrated in FIG. 4.

As illustrated in FIG. 4, two photoelectric conversion devices PD electrically isolated are disposed in a region corresponding to one pixel of the pickup image in the pixel array 23. Further, the floating diffusion FD, a gate RG of the reset transistor RST, and a gate G of the amplification transistor AMP are arranged between the two photoelectric conversion devices PD.

Further, each of transfer gates TG of the transfer transistors TRS is respectively arranged on a semiconductor layer located between each of the photoelectric conversion devices PD and the floating diffusion FD. A shallow trench isolation (STI) 64 is arranged between the reset transistor RST, amplification transistor AMP, and two photoelectric conversion devices PD. The mentioned STI 64 is disposed so as to surround the reset transistor RST and amplification transistor AMP.

Thus, the pixel array 23 includes a configuration in which the floating diffusion FD, reset transistor RST, address transistor ADR, and amplification transistor AMP are shared by the two photoelectric conversion devices PD.

According to this configuration in the pixel array 23, size reduction can be achieved, compared with a pixel array in which the floating diffusion, reset transistor, address transistor, and amplification transistor are provided for each of the photoelectric conversion devices PD.

In the above-mentioned pixel array 23, the charge accumulating region in each of the photoelectric conversion devices PD and channels of the reset transistor RST and amplification transistor AMP are generally disposed on the same semiconductor layer. For this reason, the pixel array 23 includes the active region for the reset transistor RST and amplification transistor AMP inside the well which is a dopant layer having conductivity type reverse to the charge accumulating region of the photoelectric conversion device PD. Further, the photoelectric conversion devices PD and channels of the reset transistor RST and amplification transistor AMP are isolated by making dopant concentration in the well higher than a predetermined value.

However, in the pixel array 23, in the case of increasing the dopant concentration in the well in order to improve device isolation characteristics, there is a problem in which, for example, modulation degree of the amplification transistor AMP is lowered and a carrier to noise ratio (C/N ratio) of an output signal is deteriorated.

More specifically, since the amplification transistor AMP operates as a source follower circuit, capacitance at the gate G is increased when the modulation degree is lowered, and a change amount of output voltage to a change amount of input voltage is reduced as well. As a result, it becomes difficult to sufficiently amplify the pixel signal to be output to the CDS 26.

Therefore, assuming that noise superimposed on the pixel signal at a post-stage of the pixel array 23 is constant in the solid-state imaging device 14, the C/N ratio indicating a ratio of the noise to the pixel signal is deteriorated by the reduced amount of amplification rate for the pixel signal.

To avoid such a situation, according to the present embodiment, the C/N ratio of the solid-state imaging device 14 is improved without degrading the device isolation characteristics between the channel of the amplification transistor AMP and the photoelectric conversion devices PD by improving the modulation degree of the amplification transistor AMP. Next, a configuration of the amplification transistor AMP will be described with reference to FIG. 5.

Figure 5:
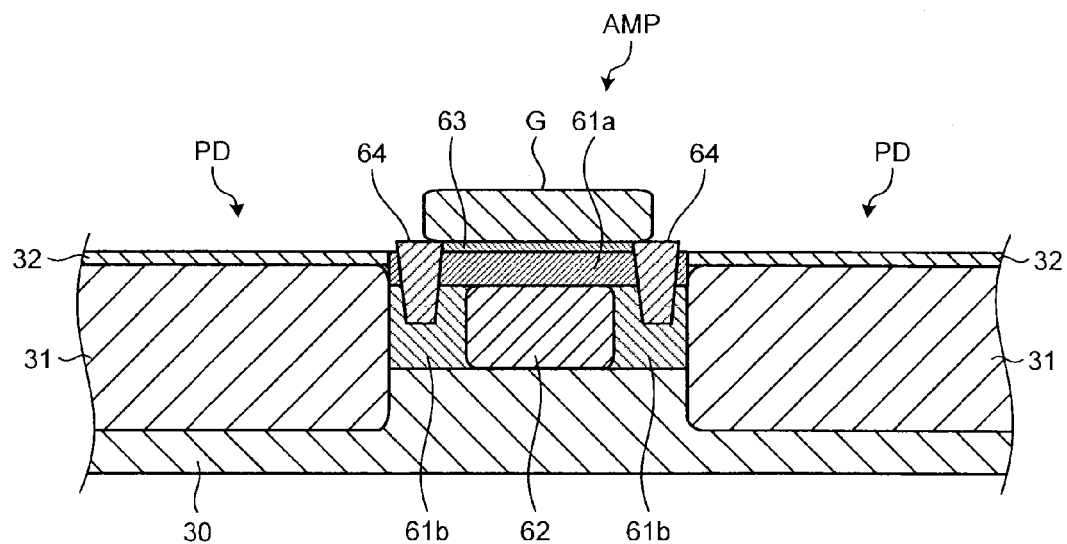
FIG. 5 is an explanatory diagram illustrating cross sectional view of an amplification transistor according to the embodiment.

FIG. 5 is an explanatory diagram illustrating a cross-sectional view of the amplification transistor according to an embodiment. Note that a cross section taken along A-A' in FIG. 4 is schematically illustrated in FIG. 5. As illustrated in FIG. 5, the amplification transistor AMP is disposed between the two photoelectric conversion devices PD.

The amplification transistor AMP in includes a gate G, a gate insulating film 63 disposed immediately below the gate G, and wells 61a, 61b in a dopant layer formed of p-type semiconductor (e.g., Si: silicon) disposed below the gate insulating film 63. The wells 61a, 61b are disposed in the same layer as the semiconductor layer where the photoelectric conversion devices PD are disposed.

Further, an STI 64 is disposed in the wells 61a, 61b on the upper surface side so as to surround the gate G. The STI 64 is formed by, for example, forming a trench by reactive ion etching (RIE) in a position where the STI 64 is formed in the wells 61a, 61b and disposing an insulating film inside the trench.

Meanwhile, although not illustrated, the amplification transistor AMP includes, inside the well 61a, a drain doped with n-type dopant in the front side of the drawing, interposing the gate insulating film 63, and includes a source doped with the n-type dopant in the rear side of the drawing. In other words, the amplification transistor AMP is an n-channel type metal oxide semiconductor (MOS).

Here, the two photoelectric conversion devices PD are photodiodes formed by, for example, p-n junction of an n-type semiconductor region 31 disposed on an n-type silicon (Si) epitaxial layer 30 and a p-type semiconductor region 32 disposed on an upper surface of the n-type semiconductor region 31. In the above-described photoelectric conversion device PD, the n-type semiconductor region 31 becomes a charge accumulation region for the signal charge generated by photoelectric conversion.

Thus, the channel of the amplification transistor AMP and the n-type semiconductor region 31 which is to be the charge accumulating region of the photoelectric conversion device PD have the same n-type conductivity type. Therefore, the wells 61a, 61b are doped with p-type dopant having relatively high concentration that can electrically isolate the channel of the amplification transistor AMP from the charge accumulating region of the photoelectric conversion device PD.

However, when the p-type dopant concentration is made too high in the wells 61a, 61b, modulation degree of the amplification transistor AMP is lowered, thereby deteriorating the C/N ratio of the solid-state imaging device 14 as described above. To avoid such a situation, the amplification transistor AMP includes, inside the well 61b, a low concentration region 62 having the p-type dopant concentration lower than the well 61b.

The modulation degree of the amplification transistor AMP is determined by a ratio between capacitance of the gate insulating film 63 and capacitance of a depletion layer. Therefore, since the amplification transistor AMP includes the low concentration region 62 having the p-type dopant concentration lower than the well 61b inside the well 61b, the capacitance of the depletion layer is reduced, thereby achieving to further improve the modulation degree, compared to a case where the low concentration region 62 is not provided.

This enables the amplification transistor AMP to increase the change amount of the output voltage to the change amount of the input voltage. As a result, assuming that the amount of noise superimposed on a pixel signal output by the amplification transistor AMP is constant, the solid-state imaging device 14 can reduce a relative proportion of noise occupied in the pixel signal at the post-stage, thereby improving (upgrading) the C/N ratio.

Further, since the amplification transistor AMP operates while forming the source follower circuit and a load transistor (not illustrated) disposed outside an area where photoelectric conversion devices PD are disposed, capacitance between the gate G and the channel is reduced by the improved modulation degree.

This reduces relative capacitance of the floating diffusion FD in view of the amplification transistor AMP. As a result, a relative amount of the noise to the signal charge is reduced in the amplification transistor AMP because of the increase of the change amount of the input voltage received at the gate G of the amplification transistor AMP. The change amount of the input voltage changes in accordance with change of the signal charge held by the floating diffusion FD.

Therefore, the solid-state imaging device 14 can reduce the relative ratio of the noise occupied in the pixel signal in the post-stage of the amplification transistor AMP, thereby improving (upgrading) the C/N ratio.

Further, the low concentration region 62 is disposed inside the well 61b formed at the position deeper than the well 61a where the channel of the amplification transistor AMP is formed. More specifically, the low concentration region 62 is disposed inside the well 61b at the depth where responsiveness of the amplification transistor AMP is not impaired and electric current does not leak between the source and the drain.

With this configuration, the p-type dopant concentration in the region immediately below the gate insulating film 63 which is to be the channel of the amplification transistor AMP is kept higher than the low concentration region 62. Therefore, according to the amplification transistor AMP, excessive decrease of threshold voltage caused by providing the low concentration region 62 can be prevented, thereby achieving to prevent the electric current from leaking between the source and the drain.

Note that the low concentration region 62 may be disposed in the semiconductor layer at a position deeper than a source region where the source of the amplification transistor AMP is formed and a drain region where the drain is formed.

Further, the low concentration region 62 is disposed more inside than an inner periphery of the STI 64 within the well 61b without contacting the inner periphery of the STI 64 disposed so as to surround the amplification transistor AMP. With this configuration, influence of noise caused by electrons generated near the STI 64 can be reduced in the amplification transistor AMP.

More specifically, since the STI 64 is formed by, for example, dry etching such as RIE as described above, a crystal defect may occur at an interfacial surface with the wells 61a, 61b. When such a crystal defect occurs at the interfacial surface between the STI 64 and the wells 61a, 61b, the electrons caused by this crystal defect may become noise and flow in the channel of the amplification transistor AMP.

To avoid such a situation, in the amplification transistor AMP, the low concentration region 62 is disposed more inside than the inner periphery of the STI 64 within the well 61b without contacting the inner periphery of the STI 64. With this configuration, influence of noise generated at the interfacial surface between the STI 64 and the wells 61a, 61b can be reduced in the amplification transistor AMP.

Next, a method for manufacturing the solid-state imaging device 14 according to an embodiment will be described with reference to FIGS. 6A to 9C. Now, manufacturing processes for the amplification transistor AMP and the reset transistor RST in the solid-state imaging device 14 will be described concurrently with reference to FIGS. 6A to 7C and FIGS. 8A to 9C.

FIGS. 6A to 7C are explanatory diagrams illustrating cross-sectional views of the manufacturing processes for the amplification transistor AMP according to the embodiment. Further, FIGS. 8A to 9C are explanatory diagrams illustrating cross-sectional views of the manufacturing processes for the reset transistor RST according to the embodiment. Note that cross sections taken along A-A' in FIG. 4 are illustrated for the manufacturing processes in FIGS. 6A to 7C and cross sections taken along B-B' in FIG. 4 are illustrated for the manufacturing process in FIGS. 8A to 9C.

Figure 6A:
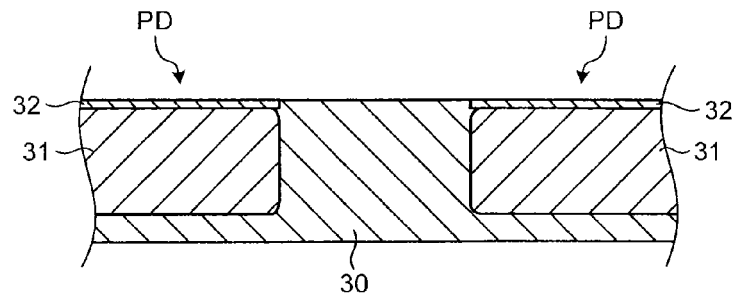
FIGS. 6A to 6D are explanatory diagrams illustrating cross-sectional views of processes for manufacturing the amplification transistor according to an embodiment.
Figure 8A:
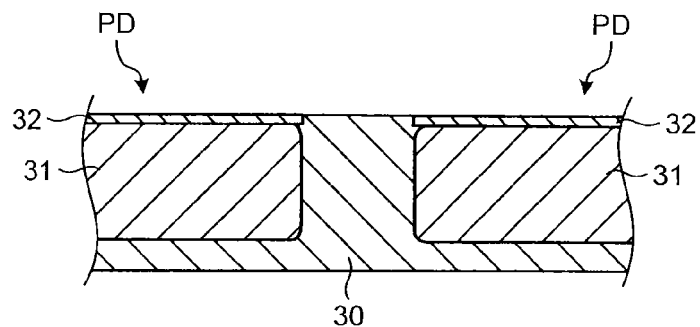
FIGS. 8A to 8C are explanatory diagrams illustrating cross-sectional views of processes for manufacturing a reset transistor according to the embodiment.

In the manufacturing process for the solid-state imaging device 14 according to the embodiment, ion implantation is executed with n-type dopant such as phosphorus at a position where the photoelectric conversion devices PD are formed in an n-type epitaxial layer 30 as illustrated in FIGS. 6A and 8A. Further, a surface layer where ion implantation has been executed with the n-type dopant is implanted with ions of p-type dopant such as boron. After that, the n-type semiconductor region 31 and the p-type semiconductor region 32 are formed by applying annealing treatment, thereby forming the photoelectric conversion device PD.

Figure 6B:
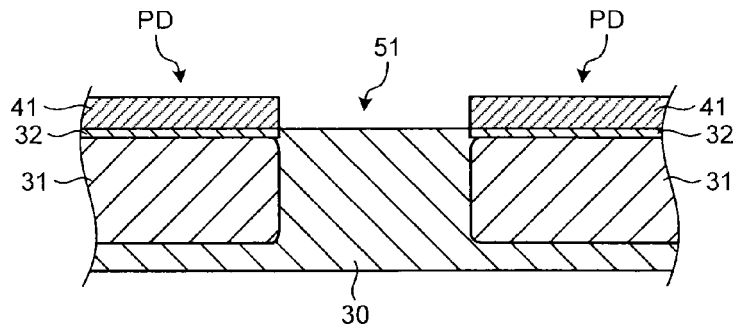
Figure 8B:
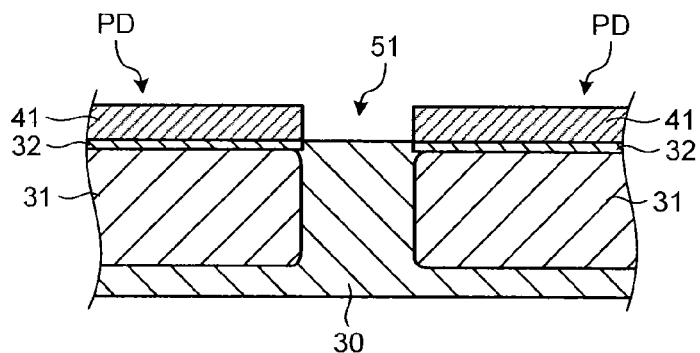

Subsequently, as illustrated in FIGS. 6B and 8B, a resist 41 having an opening 51 is formed in a region where the photoelectric conversion devices PD are not formed in the n-type epitaxial layer 30. Then, annealing treatment is applied to the surface layer of the n-type epitaxial layer 30 from the opening 51 of the resist 41 after executing the ion implantation with the p-type dopant such as boron, for example.

In this process, ion implantation is executed under process conditions such that the later-formed amplification transistor AMP, the channel of the reset transistor RST, and the photoelectric conversion device PD can be isolated, and further, the threshold voltage of the amplification transistor AMP becomes a desired value. The process conditions of ion implantation are set such that the concentration of boron becomes approximately $4*10^{16}$ atom/cm3, for example.

Figure 6C:
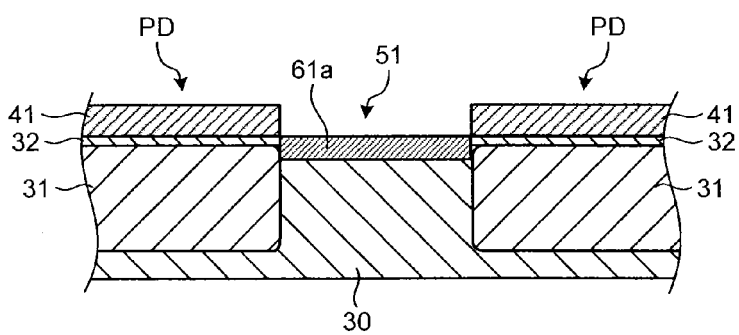
Figure 8C:
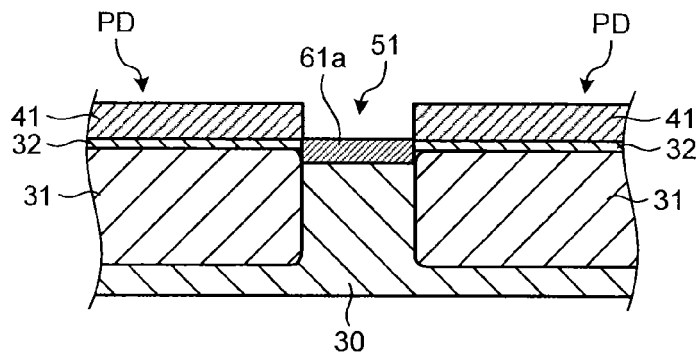

Further, in this process, annealing treatment is executed under the process conditions that the p-type dopant is diffused up to the depth at which the channel of the amplification transistor AMP to be formed finally is formed. By this process, the well 61a is formed as illustrated in FIGS. 6C and 8C.

Subsequently, ion implantation with the p-type dopant such as boron is executed from the opening 51 of the resist 41 to the n-type epitaxial layer 30 up to a position deeper than the well 61a by using the resist 41 as a mask, and then annealing treatment is applied.

Figure 6D:
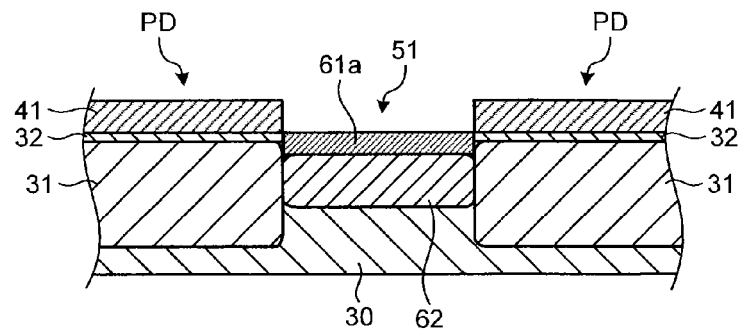
Figure 9A:
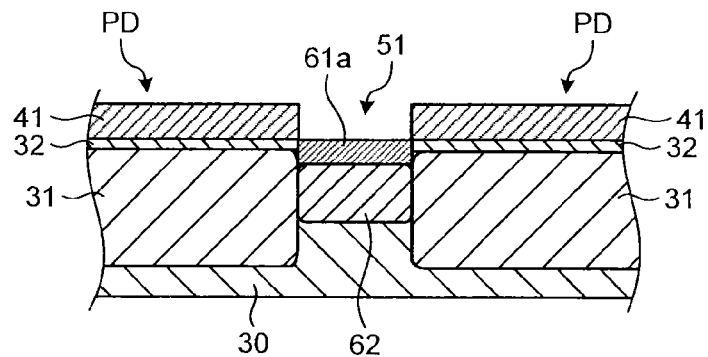
FIGS. 9A to 9C are explanatory diagrams illustrating cross-sectional views of the processes for manufacturing the reset transistor according to the embodiment.

In this process, ion implantation is executed with the p-type dopant under the process condition that the p-type dopant concentration becomes lower than the later-formed well 61b (see FIGS. 5, 7B, and 9B). The process conditions of ion implantation are set such that the concentration of boron becomes approximately $3*10^{16}$ atom/cm3. By this process, the low concentration region 62 is formed in a position deeper than the well 61a as illustrated in FIGS. 6D and 9A.

Figure 7A:
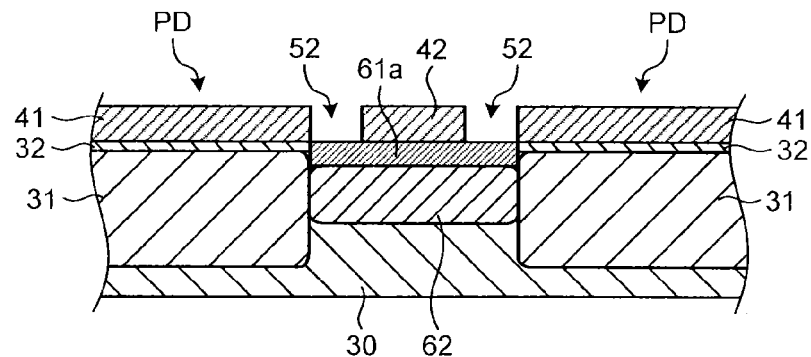
FIGS. 7A to 7C are explanatory diagrams illustrating cross-sectional views of the processes for manufacturing the amplification transistor according to the embodiment.

After that, as illustrated in FIG. 7A, a resist 42 is formed so as to cover a center region of the upper surface of the well 61a. In this process, the resist 42 is formed having the size that can be included inside the inner periphery of the STI 64 in the top view without contacting the inner periphery of the STI 64 which is later formed so as to surround the amplification transistor AMP. By this process, a groove 52 is formed between the resist 41 and the resist 42.

Here, an area occupied by the photoelectric conversion devices PD in the solid-state imaging device 14 has to be s large as possible from the viewpoint of increasing the number of saturation electrons and improving light sensitiveness of the photoelectric conversion devices PD. To achieve this, the area occupied by a switch transistor such as the reset transistor RST is designed be small.

In contrast, the amplification transistor AMP is designed to have a longer channel length and a larger channel width, compared to the reset transistor RST because 1/f noise considerably affects random noise. By this design, the resist 42 can be formed by relatively simply patterning on a center region of the well 61a where the amplification transistor AMP is formed, and as a result, the groove 52 is formed between the resist 41 and the resist 42.

After that, ion implantation is executed with p-type dopant such as boron from the groove 52 illustrated in FIG. 7A and the opening 51 illustrated in FIG. 9A to the low concentration region 62, and then annealing treatment is applied.

In this process, ion implantation is executed with the p-type dopant under the process condition that the dopant concentration reaches to the concentration at which the later-formed amplification transistor AMP, the channels of the reset transistor RST, and photoelectric conversion device PD can be isolated. The process conditions of ion implantation are set such that the concentration of boron becomes approximately $6*10^{16}$ atom/cm3, for example.

Further, in this process, annealing treatment is applied under the process condition that p-type dopant is diffused to the depth at which the later-formed amplification transistor AMP, the channel of the reset transistor RST, and the photoelectric conversion device PD can be isolated.

Figure 7B:
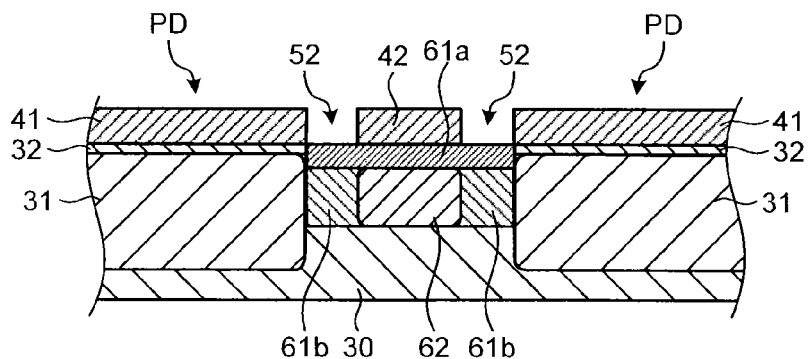
Figure 9B:
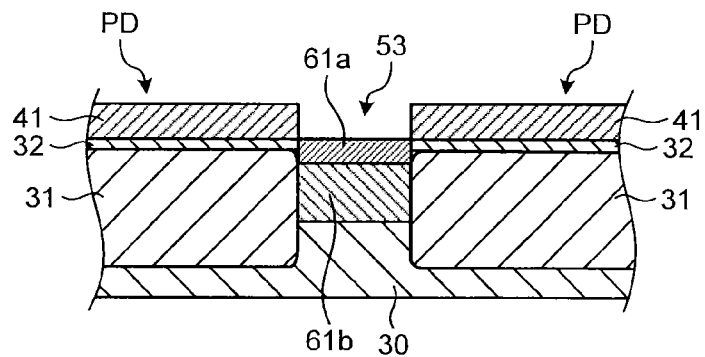

By this process, the well 61b is formed as illustrated in FIGS. 7B and 9B. This well 61b finally comes to have the concentration of boron approximately $9*10^{16}$ atom/cm3 because the well 61b is formed by executing ion implantation and annealing treatment twice.

Figure 7C:
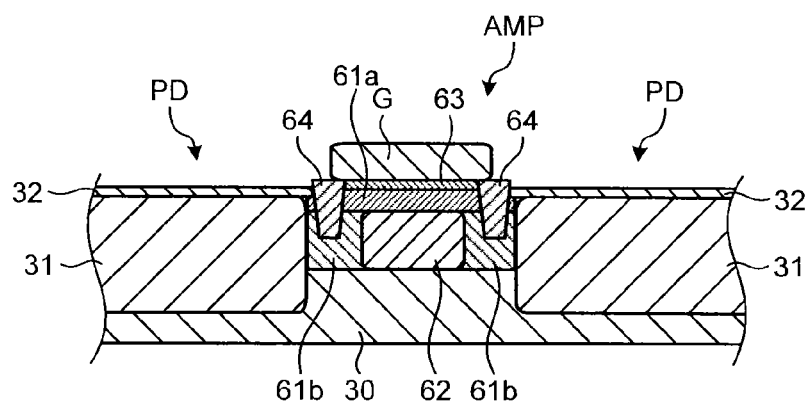
Figure 9C:
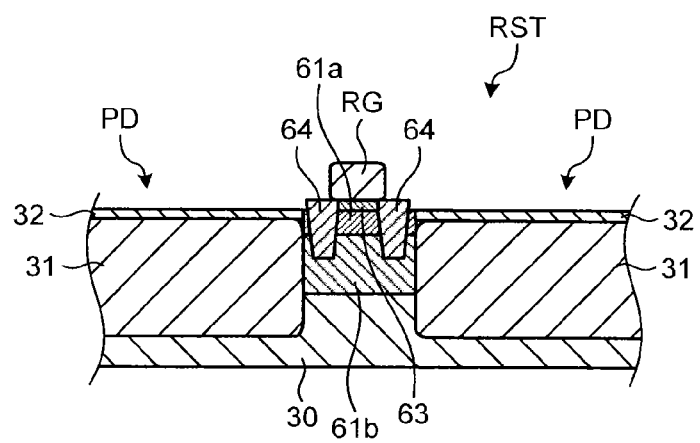

Subsequently, the resist 41 and resist 42 are stripped as illustrated in FIGS. 7C and 9C, and then the STIs 64 are formed at outer edge portions of the wells 61a, 61b, thereby forming the gate insulating film 63 in a region surrounded by the STI 64 on the upper surface of the well 61a. Further, the gate G is formed at a region on the gate insulating film 63 where the amplification transistor AMP is formed, and a gate RG is formed at a region on the gate insulating film 63 where the reset transistor RST is formed.

The STI 64 is formed on the outer edge portion of the wells 61a, 61b by forming a trench reaching to a position deeper than the lower surface of the well 61a from the upper surface of the well 61a by executing, for example, RIE, and embedding silicon oxide in the trench. By this process, the STI 64 is formed to a position deeper than the channels of the later-formed amplification transistor AMP and reset transistor RST.

The gate insulating film 63 is formed of, for example, silicon oxide. At this point, a gate insulating film of the transfer transistor TRS is also formed at the same time. Further, the gate G and the gate RG are formed of, for example, polysilicon. At this point, the gate of the transfer transistor TRS is also formed at the same time.

Then, a source and a drain of the amplification transistor AMP and a source and a drain of the reset transistor RST are respectively formed inside the wells 61a, interposing the gate G and the gate RG respectively. The source and drain are formed by, for example, applying annealing treatment after executing ion implantation with the p-type dopant such as phosphorus to the well 61a. By this process, the transfer transistor TRS, reset transistor RST, and amplification transistor AMP are formed.

As described above, the solid-state imaging device according to an embodiment includes the low concentration region at the center region inside the well of the amplification transistor that amplifies the signal charge obtained by photoelectric conversion by the photoelectric conversion device. The low concentration region contains dopant having the conductivity type same as the dopant contained in the well and having the concentration lower than the well.

With this configuration, modulation degree of the amplification transistor can be improved without degrading device isolation characteristics between the channel of the amplification transistor and the photoelectric conversion devices. Therefore, the solid-state imaging device according to the embodiment can improve (upgrade) a C/N ratio of a pixel signal to be output.

Note that the above-described embodiment is merely an example, and therefore, various modifications can be applied. For example, according to the above-described embodiment, the low concentration region 62 illustrated in FIG. 6D is formed after the well 61a illustrated in FIG. 6C is formed, but the well 61a may be formed after the low concentration region 62 is formed.

Further, according to the above-described embodiment, the low concentration region 62 is disposed at the center region inside the well 61b of the amplification transistor AMP, but the low concentration region 62 may be disposed at a center region inside a well of a different transistor included in the solid-state imaging device 14. With this configuration, responsiveness of each transistor provided with the low concentration region 62 can be improved.

Further, the n-type dopant and the p-type dopant in the above-described solid-state imaging device 14 may have reverse conductivity types respectively. In this case, each of the transistors included in the solid-state imaging device 14 is to be p-channel type transistor. In the case of disposing the low concentration region in the p-channel type transistor, the n-type low concentration region having the dopant concentration lower than the well is provided at a center region inside an n-type well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
a plurality of photoelectric conversion devices disposed on a semiconductor layer;
a dopant layer disposed on the semiconductor layer where the photoelectric conversion devices are arrayed, and including dopant having conductivity type reverse to a charge accumulating region of the photoelectric conversion device;
a low concentration region disposed inside the dopant layer, and having dopant concentration lower than the dopant layer; and
an amplification transistor configured to amplify signal charges obtained by photoelectric conversion by the photoelectric conversion devices, and including an active region on the dopant layer.

2. The solid-state imaging device according to claim 1, wherein
the low concentration region is disposed, inside the dopant layer, at a position deeper than a region where a channel of the amplification transistor is formed.

3. The solid-state imaging device according to claim 1, wherein
a shallow trench isolation (STI) configured to surround the amplification transistor is disposed in the dopant layer, and
the low concentration region is disposed more inside than an inner periphery of the STI without contacting the inner periphery of the STI.

4. The solid-state imaging device according to claim 3, wherein
the shallow trench isolation (STI) is formed up to a position deeper than the channel of the amplification transistor.

5. The solid-state imaging device according to claim 1, wherein
the low concentration region is disposed, in the semiconductor layer, at a position deeper than a source area and a drain area of the amplification transistor.

6. The solid-state imaging device according to claim 1, wherein the dopant layer includes:
a first dopant layer disposed on a surface layer of the semiconductor layer; and
a second dopant layer disposed, in the semiconductor layer, at a position deeper than the first dopant layer, configured to surround a side peripheral surface of the low concentration region, and having the dopant concentration higher than the first dopant layer.

7. A method of manufacturing a solid-state imaging device comprising:
forming a plurality of photoelectric conversion devices on a semiconductor layer;
forming a dopant layer on the semiconductor layer where the photoelectric conversion devices are arrayed, and the dopant layer including a dopant having conductivity type reverse to a charge accumulating region of the photoelectric conversion device;
forming, inside the dopant layer, a low concentration region having dopant concentration lower than the dopant layer; and
forming an active region of a transistor on the dopant layer, the transistor configured to amplify signal charges obtained by photoelectric conversion by the photoelectric conversion devices.

8. The method of manufacturing a solid-state imaging device according to claim 7, including forming the low concentration region, inside the dopant layer, at a position deeper than a region where a channel of the transistor is formed.

9. The method of manufacturing a solid-state imaging device according to claim 7, including:
forming a shallow trench isolation (STI) configured to surround the transistor in the dopant layer; and
forming the low concentration region more inside than an inner periphery of the STI without contacting the inner periphery of the STI.

10. The method of manufacturing a solid-state imaging device according to claim 9, including forming the shallow trench isolation (STI) up to a position deeper than the channel of the transistor.

11. The method of manufacturing a solid-state imaging device according to claim 7, including forming the low concentration region, in the semiconductor layer, at a position deeper than a source area and a drain area of the transistor.

12. The method of manufacturing a solid-state imaging device according to claim 7, including forming the dopant layer by:
forming a first dopant layer on a surface layer of the semiconductor layer; and
forming a second dopant layer, in the semiconductor layer, at a position deeper than the first dopant layer, configured to surround a side peripheral surface of the low concentration region, and having the dopant concentration higher than the first dopant layer.

* * * * *